United States Patent

Ellis

(12) United States Patent
(10) Patent No.: US 6,868,861 B2
(45) Date of Patent: Mar. 22, 2005

(54) LEVEL CONTROL SYSTEM FOR SHEET CASTING PROCESS

(75) Inventor: James Edward Ellis, Tempe, AZ (US)

(73) Assignee: Credence Engineering, Inc., Tempe, AZ (US)

(*) Notice: Subject to any disclaimer, the term of this patent is extended or adjusted under 35 U.S.C. 154(b) by 257 days.

(21) Appl. No.: 10/008,311

(22) Filed: Nov. 6, 2001

(65) Prior Publication Data

US 2003/0084938 A1 May 8, 2003

(51) Int. Cl.$^7$ .......................... B22D 11/16; F16K 21/18
(52) U.S. Cl. ........................ 137/392; 73/293; 137/2; 137/386; 137/486; 137/487; 137/599.11; 137/601.13; 137/601.14; 137/601.2; 164/155.2; 164/450.4; 250/577; 251/5; 251/7
(58) Field of Search ................................ 137/386, 392, 137/393, 115.01, 115.03, 115.13, 486, 487, 599.11, 601.13, 601.14, 601.2; 73/293; 164/155.2, 155.4, 155.5, 429, 431, 432, 450.4, 453, 457; 250/577; 251/4, 7, 5

(56) References Cited

U.S. PATENT DOCUMENTS

| | | | | |
|---|---|---|---|---|
| 2,588,672 A | * | 3/1952 | Turvey | 137/386 |
| 2,606,297 A | * | 8/1952 | Sweet | 250/577 |
| 3,842,894 A | * | 10/1974 | Southworth et al. | 164/450.4 |
| 3,864,577 A | * | 2/1975 | Pellett et al. | 250/577 |
| 3,982,724 A | * | 9/1976 | Citrin | 251/7 |
| 4,069,838 A | * | 1/1978 | Hansel et al. | 137/392 |
| 4,276,921 A | * | 7/1981 | Lemmens et al. | 164/450.4 |
| 4,354,984 A | * | 10/1982 | Richardson et al. | 73/293 |
| 4,445,238 A | * | 5/1984 | Maxhimer | 137/392 |
| 4,598,107 A | * | 7/1986 | Herron et al. | 523/351 |
| 4,600,047 A | * | 7/1986 | Matoba et al. | 164/453 |
| 4,635,897 A | * | 1/1987 | Gallant | 251/4 |
| 4,658,149 A | * | 4/1987 | Miranda et al. | 250/577 |
| 5,776,382 A | | 7/1998 | Kim et al. | 264/16 |
| 5,795,520 A | | 8/1998 | Scalia et al. | 264/146 |

* cited by examiner

*Primary Examiner*—George L. Walton
(74) *Attorney, Agent, or Firm*—Cahill, von Hellens & Glazer, P.L.C.

(57) ABSTRACT

A level control system for controlling the thickness of a work material in a slurry form cast upon a moving belt includes a fluid reservoir disposed above the belt, a sensor lens assembly for sensing the slurry height within such reservoir, and a control valve for adding slurry to the reservoir. A lens disposed near the moving belt and above the reservoir is coupled by fiber optics to a remote sensor amplifier for detecting the height of the slurry. A control circuit responsive to the light sensor regulates the flow rate of the slurry through the control valve.

5 Claims, 6 Drawing Sheets

LEVEL CONTROL SYSTEM FOR SHEET CASTING PROCESS

CROSS-REFERENCE TO RELATED APPLICATION

This application is being filed concurrently with related application Ser. No. 10/008,310, entitled "PROPORTIONAL FLOW CONTROL VALVE," assigned to the assignee of the present invention, and naming James E. Ellis as the inventor.

BACKGROUND OF THE INVENTION

1. Field of the Invention

The present invention relates generally to sheet casting processes for producing continuous tapes or sheets of material from a liquid slurry, and more particularly to an improved level control system for maintaining the thickness of such tapes or sheets at a uniform, desired thickness.

2. Description of the Related Art

Continuous sheet casting processes are well known in the art for producing elongated tapes or sheets of material of a desired thickness. For example, it is well known to cast ceramic tape by depositing a liquid slurry, containing the ceramic material dissolved in a solvent, onto a moving belt, passing the belt under a "doctor" blade to limit the thickness of the slurry, and curing the tape by driving off the solvent in a heating step to leave an elongated tape of solid ceramic material. Such a ceramic tape might be used, for example, in the manufacture of interconnect substrates for microelectronics.

In known sheet casting processes of this general type, the most common method of controlling the thickness of the tape is to control the height of the aforementioned "doctor" blade. A feedback control system has been used wherein the height of the tape is determined on the downstream side of the "doctor blade," i.e., after the tape has passed beyond the "doctor" blade. In some systems, the tape height is determined just beyond the "doctor" blade when the tape is still "wet;" in other systems, the tape height is determined further downstream after the tape has cured. In either case, information relating to the tape height is used to control the height of the "doctor" blade above the moving belt in order to maintain the tape at a desired thickness. However, raising and lowering the height of the "doctor" blade only goes so far in producing a cast tape of uniform thickness.

Known casting systems often include valves for regulating the deposition of the slurry onto the moving belt of the casting system. The slurry is supplied from a pressurized source, or is pumped from an un-pressurized source, through a flexible tube. As the slurry can be abrasive and damaging to common types of control valves, the flow of slurry is typically controlled by a "pinch-off" control valve that extends about the flexible slurry supply tube. This pinch-off valve is typically either open (i.e., out of contact with the supply tube) or closed (i.e., it pinches off the supply tube). The slurry passing through the control valve is discharged into a reservoir located above the moving belt. In turn, the reservoir releases slurry onto the moving belt upstream from the "doctor" blade. It is known to include a sensor for sensing the slurry level in the reservoir to open or close the control valve in order to selectively discharge additional slurry into the reservoir. However, this process of regulating the level of slurry in the reservoir tends to be a discontinuous, start-and-stop process, which does not contribute to the production of a tape with uniform thickness. In addition, the application of excessive force to the supply tube during pinch-off (excessive crushing force) can prevent the supply tube from fully-opening when full-flow is later needed. Another problem that arises is that, depending on the type of tape being cast and the nature of the slurry, the diameter of the slurry supply tube that fills the slurry reservoir can vary, thereby changing the requirements of the pinch-off valve.

Moreover, solvent-based slurries pose a risk of explosion, as the solvent flames are often volatile. Known casting systems that sense the height of the tape downstream from the "doctor" blade use electronic sensors that are positioned in close proximity to the tape. However, such electronic sensors are subject to the creation of electrical sparks that, under some circumstances, could cause a dangerous and damaging explosion.

Accordingly, it is an object of the present invention to provide a level control system for a tape casting process capable of producing a casted tape with a thickness that is more uniform than tapes that are currently produced.

It is another object of the present invention to provide such a level control system that is relatively inexpensive and simple to construct.

Yet another object of the present invention is to provide such a level control system which reduces the risk of explosion of volatile solvent fumes while sensing the height of the tape being casted in real time.

A further object of the present invention is to provide such a level control system wherein the supply of slurry to the moving belt can be better regulated in a continuous manner as opposed to a start-and-stop manner.

These and other objects of the present invention will become more apparent to those skilled in the art as the description of the present invention proceeds.

SUMMARY OF THE INVENTION

Briefly described, and in accordance with one aspect thereof, the present invention relates to a level control system that includes a moving belt, as well as a fluid reservoir for dispensing slurry onto the moving belt. The reservoir is, in turn, supplied by additional slurry through a control valve at a controlled rate. A blade, which may correspond with the front wall of the reservoir, is positioned above the moving belt for regulating the thickness of the slurry that passes beyond such blade. A lens is positioned generally proximate the moving belt for receiving light reflected from the upper surface of the slurry; preferably, this lens is positioned just above the slurry reservoir. A fiber optic cable extends between the lens and a remotely-located light sensor for coupling light received by the lens to the light sensor. The light sensor generates electrical signals in response to light received thereby, and a control circuit responsive to the electrical signals created by the light sensor produces a control signal that drives a control valve for regulating the flow of slurry therethrough. Preferably, the aforementioned control valve is responsive to pneumatic pressure; in this case, the control circuit provides the control signal to the control valve in the form of a regulated pneumatic pressure. In the preferred embodiment of the present invention, the regulated pneumatic pressure is substantially inversely proportional to the rate of flow of slurry through the control valve.

DETAILED DESCRIPTION OF THE PREFERRED EMBODIMENTS

Figure 1:
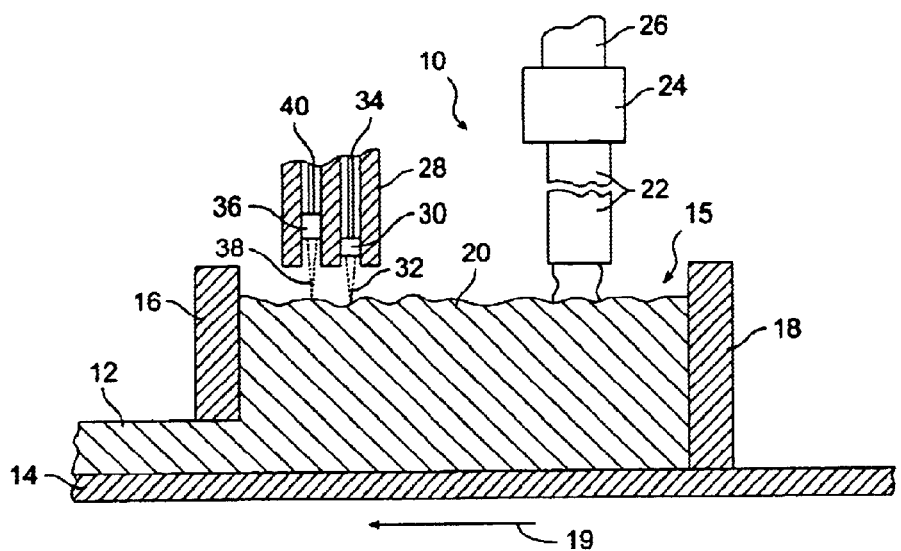
FIG. 1 is a cross-sectional drawing of a slurry casting system using a slurry reservoir positioned over a moving belt, wherein the height of the slurry in the reservoir is controlled in accordance with the present invention.

Referring to FIG. 1, a portion of a slurry casting system is shown in cross-section, including a level control system, designated generally by reference numeral 10, for controlling the thickness of slurry 12. The slurry casting system includes a moving belt 14 on which slurry 12 is carried in the direction indicated by arrow 19. Slurry 12 is sourced by a slurry reservoir 15 which includes a front wall 16 (also known as a "blade"), a rear wall 18, and two connecting side walls (not shown) extending therebetween to form a box-like container positioned over moving belt 14. Slurry reservoir 15 is filled with a supply of slurry 20 that is dispensed onto moving belt 14. Note that front wall 16 does not extend all the way down to moving belt 14; accordingly, a quantity of slurry 12 passes under the lower edge of front wall 16 and moves away from reservoir 15 along with moving belt 14. The height, or thickness, of slurry 12 is a function of 1) the slurry consistency; 2) the height of the lower edge of front wall 16 above moving belt 14; 3) the speed of moving belt 14; and 4) the height of slurry 20 within reservoir 15. It is common to position a second, separate blade (not shown) above moving belt 14 downstream from front wall 16 to further regulate the thickness of the cast slurry that passes beyond reservoir 15. The level control system described herein greatly improves upon the accuracy of such dual-blade systems.

As mentioned above, one of the factors which can influence the thickness of the cast slurry 12 is the height of slurry 20 in reservoir 15. Accordingly, it is important to control the height of slurry 20. In order to maintain such height relatively constant, new slurry must be added to reservoir 15 at the same rate that slurry leaves reservoir 15 under front wall 16. In FIG. 1, slurry 20 is replenished by a slurry supply tube 22 that is coupled to a pressurized source of slurry 26 by flow control valve 24. Flow control valve 24 must be operated to fill slurry reservoir 15 with slurry 20 at a controlled rate in order to maintain the height of slurry 20 relatively constant. Flow control valve 24 is located as close to the reservoir as practical; it provides real-time flow control of the slurry to reservoir 15.

Also shown in FIG. 1 is a sensor lens assembly 28 disposed relatively near moving belt 14, and more particularly in the preferred embodiment, just above slurry reservoir 15 for receiving light reflected from the upper surface of slurry 20. Sensor lens assembly 28 includes a lens 30 which shines a beam of light 32 downward toward slurry 20; this beam of light is supplied remotely from a light source. Light beam 32 is partially reflected off of the surface of slurry 20 and is received by lens 30. As shown in FIG. 1, a pair of optical fibers 34 extend within sensor lens assembly 28, one to bring the source of the light to lens 30 from the remote source, and a second to carry reflected light received by lens 30 to a remotely-located sensor assembly. As will be explained in greater detail below, this reflected light can be used to determine the relative height of slurry 20 within reservoir 15, and this height information can be used to regulate control valve 24 in order to maintain such height relatively constant.

In the preferred embodiment of the present invention, sensor lens assembly 28 also includes a second lens 36 and second pair of optical fibers 40 for transmitting and receiving a second light beam 38. Lens 36 and optical fibers 40 are used to sense an "overfill" condition wherein the height of slurry 20 has risen above some maximum safe threshold. Those skilled in the art will appreciate that lens elements 30 and 36, and optical fiber pairs 34 and 40, do not conduct any electrical current. Accordingly, they present no risk of creating sparks that could ignite volatile fumes emitted by slurry 20.

Figure 2:
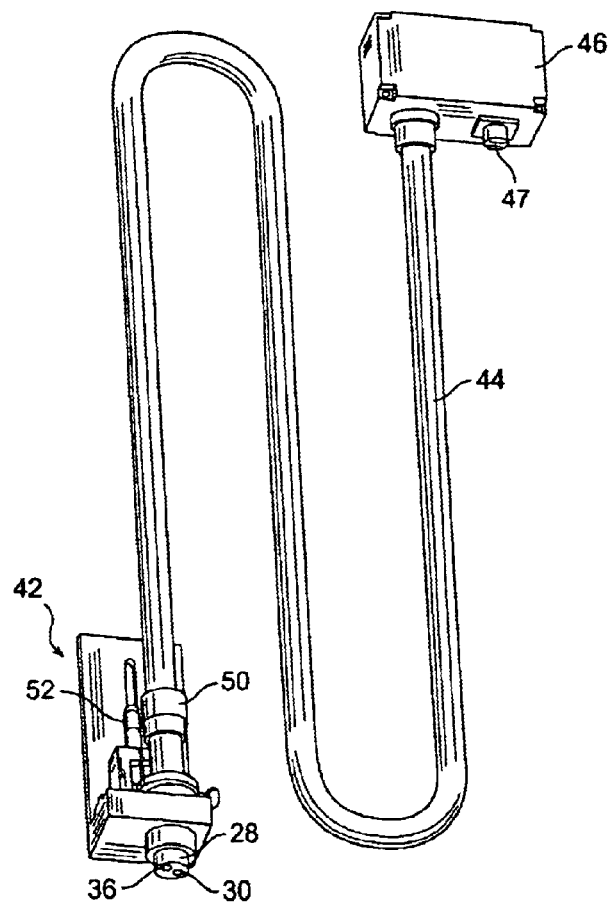
FIG. 2 is a perspective view of a slurry height sensor including a lens assembly, fiber optic cable, and remotely located light sensor.
Figure 3:
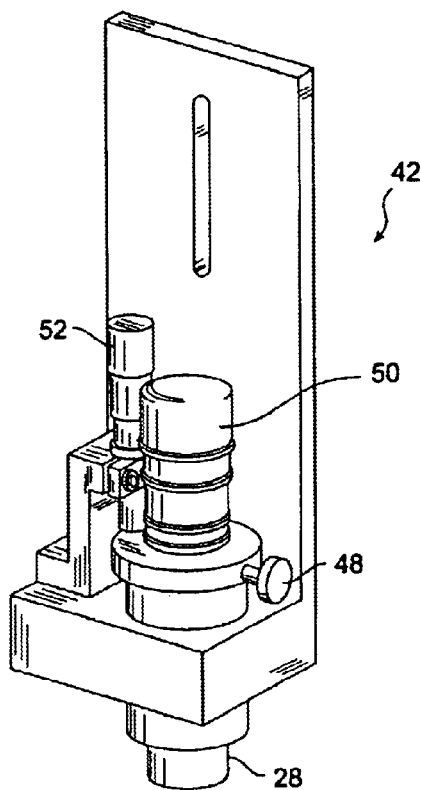
FIG. 3 is a close-up perspective view of the adjustable lens assembly shown in FIG. 2.

Turning to FIGS. 2 and 3, sensor lens assembly 28 is shown in greater detail, along with a related light sensor assembly and interconnecting flexible cable. Sensor lens assembly 28, containing lens 30 and lens 36, is movably mounted in height adjustment mechanism 42 that provides vertical adjustment of sensor lens assembly 28 relative to the upper surface of slurry 20. Height adjustment mechanism 42 is mounted on or above slurry reservoir 15 so that sensor lens assembly 28 can continuously monitor the level of slurry 20 within reservoir 15. The focal point of lens 30 is approximately 0.900 inches on a white body material; the closer the lens is to the slurry, the higher the resolution that is obtained. When operating normally, slurry 20 is maintained within a range of 0 to 0.5 inches below the focal point of lens 30. Height adjustment mechanism 42 can raise the height of sensor lens assembly 28 up and down within approximately a 2.5" rough adjustment, and a one-half inch accurate adjustment. The adjustment micrometer can adjust the sense point within one thousandth of an inch. The rough adjustments are made first via adjustment knob 50, followed by fine adjustment using micrometer 52, in order to control the height of slurry 20 in reservoir 15.

As shown in FIG. 2, sensor lens assembly 28 is coupled by an interconnecting flexible cable 44 to a light sensor assembly 46. Flexible cable 44 houses optical fiber pairs 34 and 40 (see FIG. 1) which extend between sensor lens assembly 28 and light sensor assembly 46. Light sensor assembly 46 includes built in light sources that provide light which is conveyed by optical fiber pairs 34 and 40 down to lenses 30 and 32, respectively. Light sensor assembly 46 also includes light sensors and related receiving amplifiers. The light sensors are responsive to light received by lenses 30 and 36; these light sensors are coupled to the receiving amplifiers. The receiving amplifier that processes the light signal sensed by lens 30 (slurry level) is analog in nature, and generates an output signal that is proportional to the sensed height of the slurry level; that receiving amplifier is compensated to linearize the received input light signal, and generates an output signal indicative of the number of inches between lens 30 and the upper surface of the slurry 20 in slurry reservoir 15. In contrast, the receiving amplifier which is responsive to light received by lens 32 is binary in nature, and provides a binary output signal indicating either a normal condition or an overfill condition. Again, light sensor assembly 46, which uses electrical circuitry, is a potential spark generator, and is therefore preferably located remote from the volatile environment of the slurry. No electrical current need pass within flexible cable 44. As will be explained in greater detail below, the housing for light sensor assembly 46 also houses a micro-controller circuit board, which includes a non-volatile memory module for storing calibration information.

Figure 4:
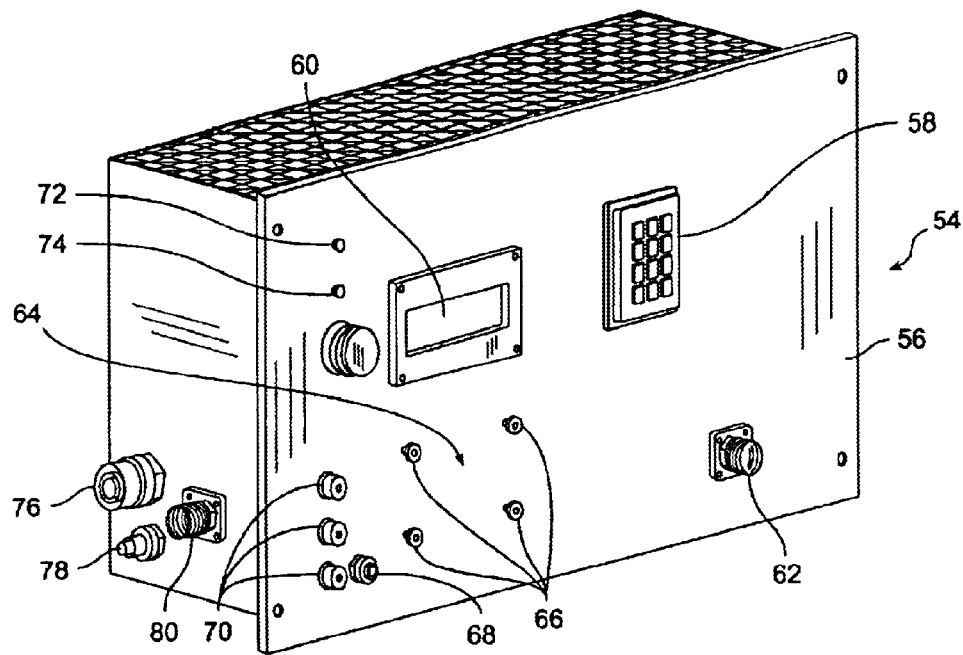
FIG. 4 is a perspective view of a control panel and control system housing for regulating slurry thickness.

FIG. 4 illustrates a controller cabinet 54 for controlling the rate at which slurry is added to slurry reservoir 15. Controller cabinet 54 is likewise a potential spark generator, and is mounted as far as practical from the volatile vapors given off by the slurry. Controller cabinet 54 houses a programmable logic controller (PLC), a proportional air regulator, a main air cutoff valve, keypad, display, start switch, analog power supply, digital power supply, alarm and E-stop (emergency stop). Controller cabinet 54 has an AC inlet using a standard plug 76 for receiving 110 volt alternating current, and a main air inlet 78 for receiving pressurized air from a source that provides 80 PSI air at the rate of 0.1 CFM. Fuses 70, located on front panel 56 of controller cabinet 54, protect electrical components from electrical shorts and/or excessive current conditions.

Keypad 58 is mounted upon front panel 56 of controller cabinet 54, and is preferably a twelve key unit that is configured similar to a touch-tone telephone keypad and/or simple calculator keypad. Ten keys correspond to the numbers 0–9, and two further keys serve as "Enter" and "Clear" keys. Keypad 58 is used for data entry and for controlling specific functions within the controller. Many of the keys are multifunctional, depending on the operation in progress.

Front panel 56 of controller cabinet 54 also includes a liquid crystal display unit 60, preferably one which is capable of displaying four lines of output. LCD display unit 60 is used to provide operator feedback; for example, it may be used to display height, set point, output level, alarm status, and also to display data being entered by a user on keypad 58. The height and set point are preferably programmed to be displayed by LCD display unit 60 at all times so that important system parameters can be monitored without interruption. Other functions such as "valve off," and "manual" versus "auto" mode, can also be displayed. In "auto" mode, LCD display unit 60 displays real-time level, set point, and output level, in 0.0002" increments.

Housing 46 (see FIG. 2), which contains the light sensor assembly and micro-controller circuit board, preferably mounts to region 64 of front panel 56 of controller cabinet 54 with four shoulder screws 66 (see FIG. 4). A short connector cable (not shown) electrically couples micro-controller circuit board output connector 47 (see FIG. 2) to input connector 62 (see FIG. 4) on front panel 56 of controller cabinet 54. The sensor amplifiers, optical fibers, and lenses that are included in sensor lens assembly 28, flexible cable 44, and light sensor assembly 46, create a unique system that must be factory calibrated to work correctly with the main controller circuitry housed in controller cabinet 54; internal adjustments cannot be made in the field. Each time the system is started, the sensor assembly micro-controller circuit board of sensor assembly 46 uploads calibration information to the main controller board within controller cabinet 54.

Connector 68, located on front panel 56 of controller cabinet 54, is a regulated air pressure outlet port for use in driving the proportional flow cut-off valve 24 shown schematically in FIG. 1. Controller cabinet 54 includes therein a proportional air-regulating valve. In accordance with the electrical signals received from light sensor assembly 46 at connector 62 of controller cabinet 54, the proportional air-regulating valve receives a 0–10 volt DC signal from a digital-to-analog converter on the controller circuit board to proportionally vary the air pressure output to connector 68. The regulated air pressure delivered to connector 68 is used to drive control valve 24, which in turn regulates the flow of slurry therethrough. If the height of slurry 20 within slurry reservoir 20 is significantly below the set height, then the air pressure output by connector 68 is relatively low, or zero, for allowing control valve 24 to fully open. On the other hand, if the height of slurry 20 within slurry reservoir 15 is approximately at the set height, then the air pressure output by connector 68 is relatively high for constricting, or even closing off, control valve 24.

Figure 8:
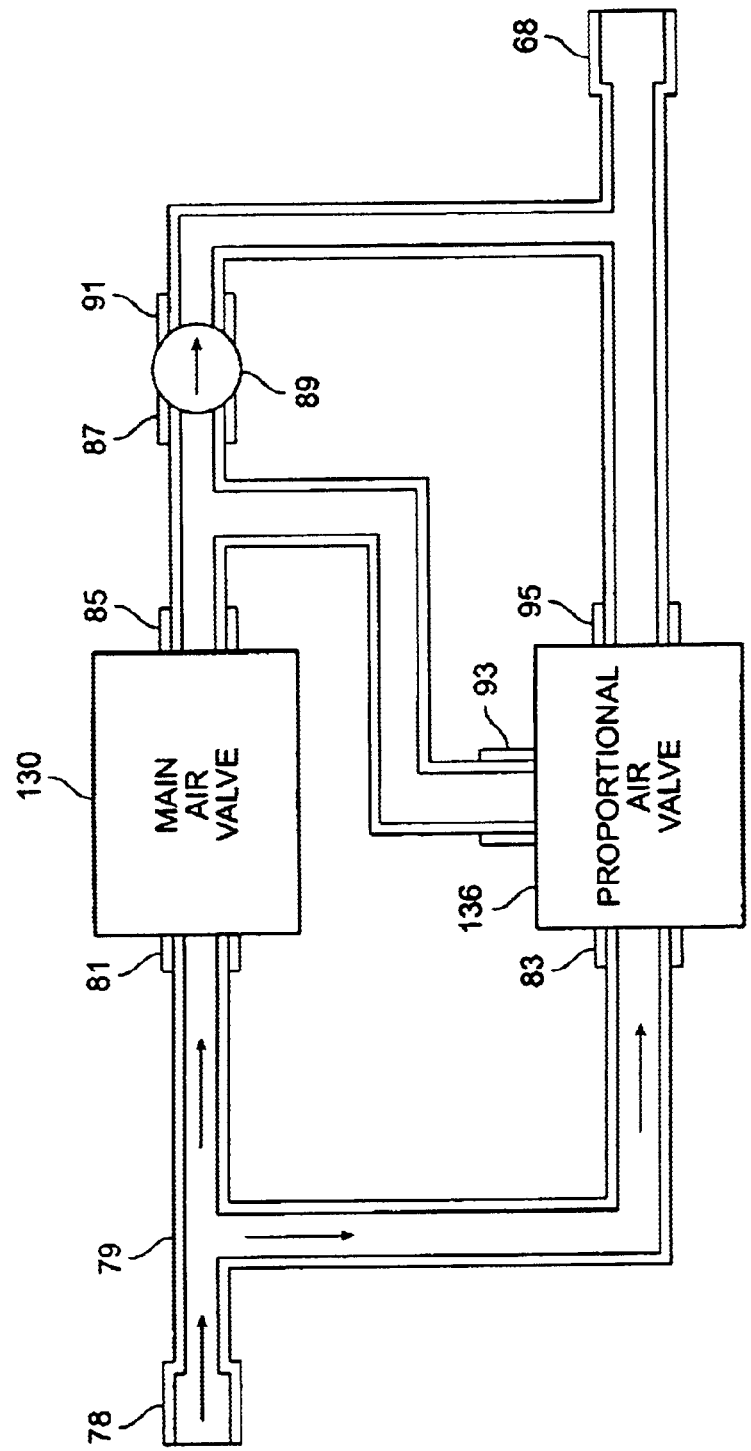
FIG. 8 is a pneumatic schematic showing plumbing connections between the air pressure source, a main air valve, a proportional air valve, related check valve, and regulated air pressure output port.

Turning briefly to FIG. 8, main air pressure inlet connector 78 of controller cabinet 54 is coupled by pipe 79 to the inlet 81 of main air valve 130 and also to the inlet 83 of proportional flow air valve 136 for supplying a source of 80 PSI air pressure. Main air valve 130 is normally open during power-off conditions. Accordingly, when electrical power is off, main air valve 130 is open and supplies 80 PSI air pressure, via output port 85 to the inlet 87 of unidirectional check valve 89. Outlet 91 of check valve 89 is coupled to regulated pressure port connector 68, and thereby supplies 80 PSI air pressure to connector 68 whenever electrical power is off. As will be explained below, in this instance, the control valve that supplies slurry to the casting system is held closed. Note that, during power outage, proportional air valve 136 is off, and air pressure supplied to inlet 83 of valve 136 is vented to exhaust port 93. In other applications of valve 136 apart from the present level control system, exhaust port 93 might be vented to atmosphere. However, in the present case, exhaust port 93 is coupled to the inlet 87 of check valve 89, so any air pressure vented by exhaust port 93 of valve 136 simply merges with the air pressure supplied by outlet 85 of main air valve 130.

Still referring to FIG. 8, when electrical power is on, main air valve 130 is turned off, and proportional air valve 136 is enabled. In a manner to be described below, valve 136 provides a regulated air pressure, between zero and 70 PSI, at its outlet 95 for coupling to connector 68. As the pressure supplied by valve 136 increases, the flow of slurry through flow control valve 24 (see FIG. 1) decreases in an inversely proportional manner.

Figure 5:
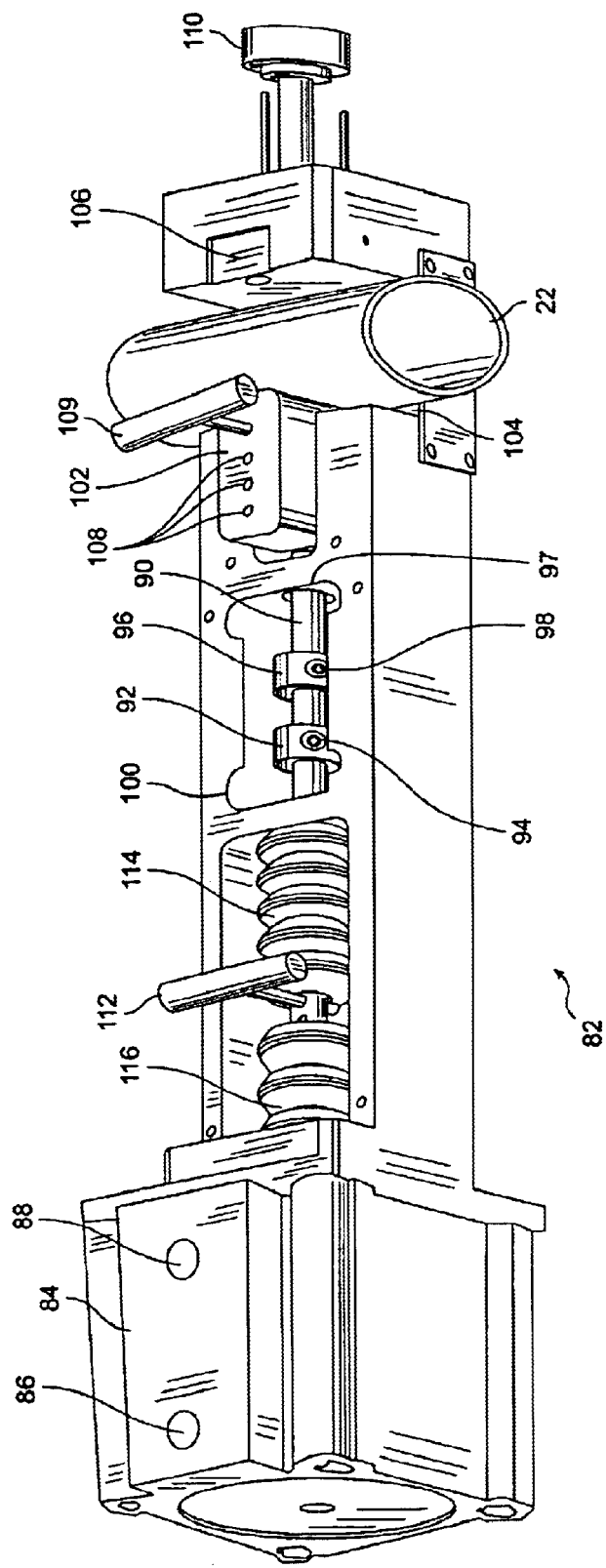
FIG. 5 is a perspective view of a preferred proportional control valve for use in practicing the present invention.

FIG. 5 illustrates a proportional flow control valve, designated generally by reference numeral 82, for controlling the flow of a fluid through a flexible tube. The function of flow control valve 82 is to proportionally control the amount of flow of slurry, or other process fluid, as determined by a controlled amount of air pressure received from controller cabinet 54. Increased air pressure causes increased pinch-off of slurry supply tube 22 (see FIG. 1), which reduces output flow of slurry from the valve; in contrast, decreasing air pressure increases flow from flow control valve 82.

The linear relationship between the pressure applied to actuator 84 of control valve 82 and the flow of fluid therethrough can be enhanced by partially deforming, or "pre-crushing," the flexible tube through which the fluid passes, even when control valve 82 is "open". In other words, when one initially begins to deform, or pinch, a flexible tube, fluid flow therethrough is not significantly impacted. It is only after the tube has been significantly deformed from its original circular cross-section to a certain pre-crushed condition that fluid flow begins to become restricted. The precise amount of pre-crush required depends in part upon the nature of the fluid and the pressure applied to the fluid by its source. Once such pre-crush point is reached, further deformation of the tube results in substantially proportional decreases in the flow rate through the tube. It is therefore advantageous to "pre-crush" the tube when the valve is "open" to improve the overall proportionality of control valve 82 as the tube is further compressed. In this manner, the entire travel of actuator 84 and pushrod 90 can be used to vary the degree of flow through the flexible tube.

The flexible tube through which the fluid flows (e.g., flexible tube 22 of FIG. 1) is placed upon a tube passageway 104, surrounded by a first jaw 102 and a second jaw 106. Jaws 102 and 106 selectively engage opposing sides of the flexible tube that is guided over passageway 104. Jaw 106 is relatively fixed during operation, although the initial position of jaw 106 can be varied by rotating adjustment knob 110 for reasons that will be explained below. On the other hand, jaw 102 is movable and is secured to the end of an axially-slidable pushrod 90. As pushrod 90 slides back and forth along its axis, jaw 102 moves back and forth therewith, thereby varying the separation distance between jaws 102 and 106. The starting point of jaw 102, relative to the end of pushrod 90, can be varied by use of tee-selector pin 109 in cooperation with adjustment holes 108. The lower end of tee-selector pin 109 is received within a corresponding hole formed in the end of pushrod 90. Tee-selector pin 109 and adjustment holes 108 provide for a gross adjustment of the separation distance between jaws 102 and 106 to facilitate the use of flow control valve 82 with flexible tubes of widely-different diameters.

The end of pushrod 90 opposite jaw 102 is coupled to an actuating cylinder housed within actuator 84. Actuator 84 is preferably of the type commercially available from SMC Corporation of America, formerly known as SMC Pneumatic, Inc., of Indianapolis, Ind. under Part No. NCQ2B63-30D, and has a cylinder head/disk that is 63 mm. in diameter. Such disk normally comes with a peripheral rubber seal ring around its periphery to form a sliding seal with the surrounding cylinder; applicant has found it to be advantageous to grind away a portion of such peripheral rubber ring to minimize friction between the disk and its surrounding cylinder. Actuator 84 includes an input pressure port 86 that is coupled to output pressure connector 68 (see FIG. 4) of controller cabinet 54 for receiving the regulated air pressure supplied thereby. Pushrod 90 can be advanced to the right (relative to FIG. 5) to decrease the separation distance between jaws 102 and 106 as the regulated air pressure applied to port 86 is increased. Flow control valve 82 also includes two series of disc springs (so-called "Belleville washers") 114 and 116, each of which includes a central aperture for allowing pushrod 90 to slide therethrough. There are preferably approximately 70 of such disc springs in all. In addition, pushrod 90 has a series of successive holes formed therein into which the lower end of Tee pin 112 may be inserted.

Preferably, each disc spring is capable of allowing 0.013" of displacement when full 70 PSI air pressure is applied to input pressure port 86. If, for example, the separation distance between jaws 102 and 106 is to be varied by 0.25" when moving between full, unrestricted flow and zero, pinched-off flow, then the travel requirement of 0.25" is divided by the displacement per spring, or 0.25"/0.013," which equals 19 springs. Accordingly, Tee pin 112 is moved to a location separating 19 springs 114 between Tee pin 112 and stationary wall 100. In this manner, Tee pin 112 and disc springs 114 control the amount of travel of pushrod 90 between zero and full pressure. When full pressure is released, disc springs 114 serve as a return spring mechanism for moving pushrod 90 back toward the left (relative to FIG. 5), increasing the separation distance between jaws 102 and 106, and increasing the flow rate through the flexible tube passing between such jaws.

When configuring flow control valve 82 for use, the user must first determine the travel requirements of pushrod 90 for a given casting process. A given casting process will establish the maximum flow rate, and supply tube diameter required. There are three general steps which need to be applied to determine such travel requirements. First, one must determine the tube size required for the process cast. If the tube size is too large, the amount of jaw travel to move between unrestricted flow and the fully-closed position will be only a small fraction of the diameter of the tube, thereby reducing the resolution of control valve 82. If, on the other hand, the diameter of the tube is too small, then the maximal flow rate through the tube will not be sufficient to keep up with the demand of the system. Secondly, the user must determine the actual stroke requirement of control valve 82. For example, it might be determined that the separation distance between jaws 102 and 106 is to be varied by 0.25" when moving between full, restricted, pre-crushed flow and zero, pinched-off flow. Lastly, control valve 82 must be configured to put out the required stroke.

For example, assume that a particular casting process requires a tube OD (outer diameter) of 0.75 inch and a tube ID (inner diameter) of 0.50 inch (i.e., a tube wall thickness of 0.125 inch); further assume that the supply tube will supply enough slurry to outrun the cast, i.e., to add slurry to the reservoir at a faster rate than slurry leaves the reservoir, even when the supply tube inner diameter is "pre-crushed," or pinched off, by one-half (i.e., the distance between opposing inner walls is one-half that of the original un-pinched inner diameter). In this case, the travel requirement for pushrod 90 of valve 82 is the supply tube inner diameter divided by two. Accordingly, since the original inner diameter was assumed to be 0.5 inch, pushrod 90 of control valve 82 needs to have a travel distance of 0.25 inch.

Flexible slurry supply tube 22 (see FIG. 1) is placed in the valve tube passageway 104. Continuing with the example described above wherein 0.25 inch of travel is desired, Tee selector pin 112 is positioned to select 19 disc springs within group 114. A relatively small amount of air pressure is then applied to input pressure port 86 of actuator 84 to get Tee pin 112 to snug-up the 19 selected disc springs within group 114 against valve dividing wall 100; this corresponds to the fully-open position of control valve 82. The user then loosens Allen-head adjustment screw 94 of full-open clamp collar 92 until clamp collar 92 lies adjacent the opposite side of valve dividing wall 100, and re-tightens Allen-head adjustment screw 94.

Now, input pressure port 86 of actuator 84 is pressurized to full pressure (70 psi), corresponding to the fully-closed position; the user then loosens Allen-head adjustment screw 98 of full-closed clamp collar 96 until clamp collar 96 lies adjacent dividing wall 97 of control valve 82, and re-tightens Allen-head adjustment screw 98. Next, adjustment knob 110 is rotated to move jaw 106 to just pinch off slurry supply tube 22 completely. It will be noted that it may be necessary to move Tee pin 109 into a different adjustment hole 108 within jaw 102 in order to get the face of jaw 102 at an adequate start position so that tube 22 can be just barely pinched off when actuator 84 is fully pressurized. This procedure limits travel of pushrod 90, and jaw 102, between the pre-crushed (minimal pressure) condition and the fully-off (full 70 PSI pressure). If greater or lesser amounts of travel are needed, the procedures already described above are repeated to calculate the number of disc springs 114 to be engaged by Tee pin 112, and to reset the positions of Tee pin 109, adjustment knob 110, and clamp collars 92 and 96. Proportional cut-off control valve 82 is now ready for use.

Those skilled in the art will appreciate that, upon being configured in the manner described above, actuator 84 is adapted to vary the separation distance between jaws 102 and 104 between an initial separation distance (the pre-crushed condition) that permits full slurry flow, and a shut-off separation distance just sufficient to fully pinch-off the flow of any slurry through flexible slurry supply tube 22. The initial separation distance is small enough to at least partially deform, or pre-crush, flexible supply tube 22, while being large enough to avoid any significant restriction of the flow of fluid therethrough. In contrast, the shut-off separation distance is just small enough to essentially block the flow of fluid through supply tube 22.

Figure 6:
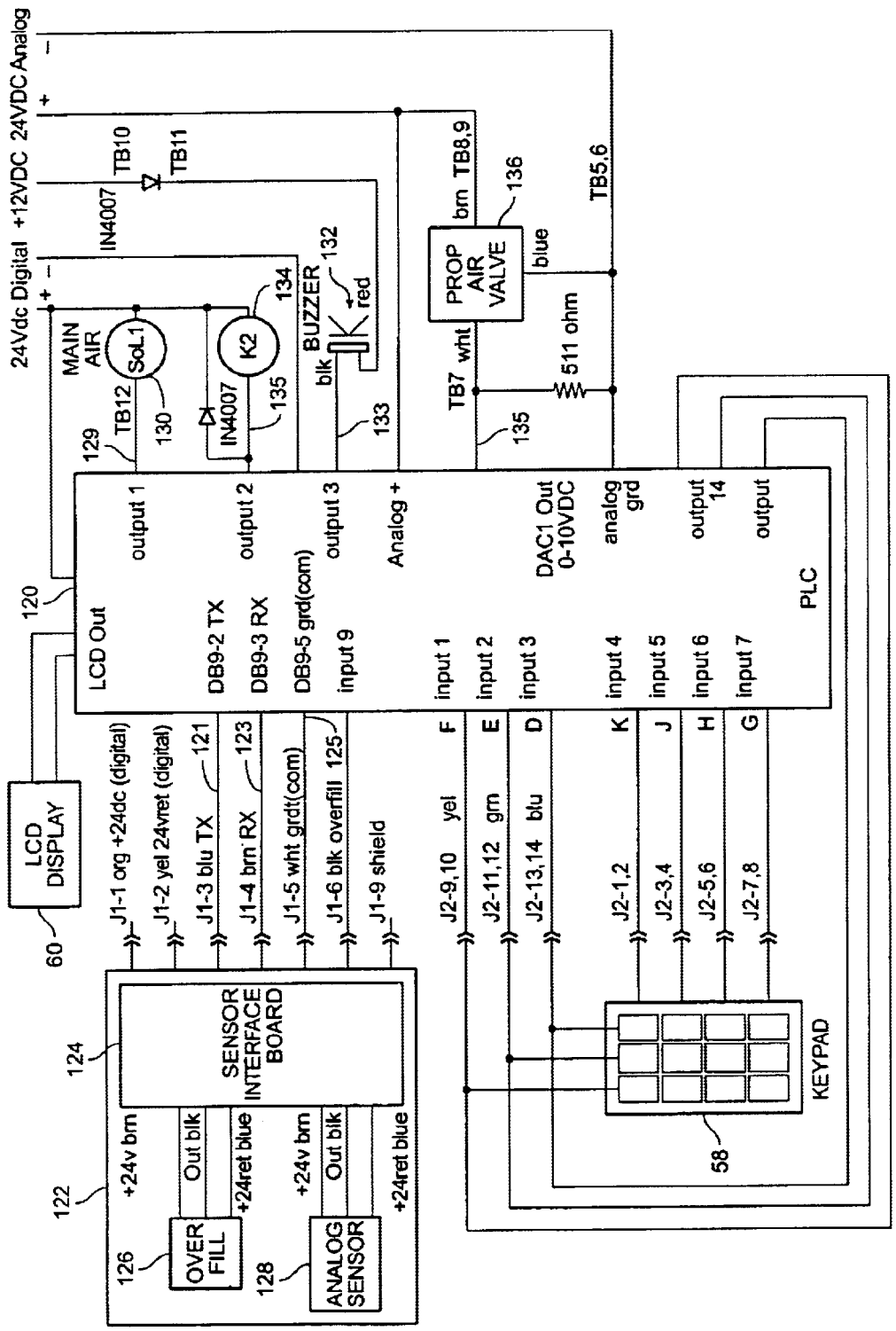
FIG. 6 is a circuit schematic drawing showing the control circuitry used to regulate the flow of slurry through the proportional control valve.

Turning to the schematic of FIG. 6, the main system controller housed within control panel 54 (see FIG. 4) includes a programmable logic controller (PLC) 120 of the type commercially available from Triangle Research International, Inc. of San Jose, Calif. under Model No. T100MD-16-16. PLC 120 includes 16 digital input terminals, 16 digital output terminals, and 5 analog input/output terminals. PLC 120 includes a built-in liquid crystal display (LCD) interface for coupling to LCD display module 60. LCD display module 60 is also commercially available from Triangle Research International, Inc. under Part No. LCD 420; display module 60 is a 4-line by 20 character-per-line backlit LCD display often used in conjunction with T100MD programmable logic controllers.

PLC 120 uses 7 of its digital input terminals to receive input signals from keypad 58. Keypad 58 is a Grayhill Series 88 sealed keypad commercially available under Part No. GH5018-ND from Digi-Key Corporation of Thief River Falls, Minn. PLC 120 of FIG. 6 also includes an RS232 communication port coupled to conductors 121, 123, and 125 which can be used to conduct serial communications with PLC 120. Before PLC 120 is actually used to control a slurry casting operation, it must first be programmed. In this initial programming phase, the RS232 communication port of PLC 120 is coupled to the serial port of a host computer for receiving operating instructions (software code) used to program the steps performed by PLC 120. PLC 120 includes an internal EEPROM program memory for storing up to 6016 words of software instructions. Once programmed, the RS232 port is used to couple PLC 120 to the sensor interface board 124 housed within light sensor assembly 46, via output connector 47 (see FIG. 2) and input connector 62 (see FIG. 4).

PLC 120 also includes an internal digital-to-analog controller for generating an analog output signal ranging between zero and 10 volts D.C. As shown in FIG. 6, one such analog output terminal is coupled by conductor 135 to a control terminal of proportional air valve controller 136. Proportional air valve 136 is of the type commercially available from SMC Corporation of America, formerly known as SMC Pneumatic, Inc., of Indianapolis, Ind. under Part No. ITV 2030-31N2L4. This valve serves to regulate output air pressure in accordance with an analog voltage applied thereto. Moreover, the output air pressure is regulated to vary proportionally with the magnitude of the analog voltage applied thereto. PLC 120 computes an eight-bit digital value indicative of the degree to which proportional air valve 136 should be opened in order to supply the desired amount of air pressure to actuator 84 of control valve 82; that eight-bit digital value is then transformed by PLC 120 into a corresponding analog voltage supplied on conductor 135 for driving proportional air valve 136. In turn, proportional air valve 136 supplies a regulated air pressure (via port 68 on front panel 56 of control panel 54) to air pressure input port 86 of actuator 84.

PLC 120 uses one of its digital output terminals to control main air solenoid 130 associated with a main air valve (not shown); this main air valve is preferably of the type commercially available from above-mentioned SMC Corporation of America under Part No. VQZ242-5L-N7T. This main air valve is interposed between the main air inlet port 78 of control panel 54 and proportional air valve 136. Conductor 129 is coupled between such output terminal and main air solenoid 130. If PLC is not powered-up, this output terminal is a high impedance; when PLC 120 is powered-up, and operating normally, conductor 129 is grounded by PLC 120, allowing current to flow through main air solenoid 130, thereby supplying the main air pressure (e.g., 80 PSI) to the air input side of proportional air valve 136.

As shown in FIG. 6, another digital output terminal of PLC 120 is used to activate a buzzer 132 via conductor 133, which serves an internal audible alarm for signaling an alarm condition. If desired, an alarm can also be created remotely using power relay 134. Power relay 134 is coupled to another digital output terminal of PLC 120 via conductor 135; when such output terminal moves low (to ground voltage), the primary coil of power relay 134 is activated, and power relay closes a secondary switching contact that can handle greater amperage. The secondary contacts of power relay 134 are accessible via port 80 on control panel 54 (see FIG. 4).

Before leaving FIG. 6, it will be noted that block 122 of FIG. 6 represents components that are located outside control panel 54, more particularly, components housed within light sensor assembly housing 46. Analog sensor amplifier 128 is coupled by fiber optics within flexible tube 44 to level sensor lens 30, while overfill sensor amplifier 126 is coupled by fiber optics within flexible tube 44 to overfill sensor lens 36. Amplifier 128 is preferably of the type commercially available from SUNX Sensors USA, a division of Ramco Inc. of West Des Moines, Iowa under the Model Name FX-11A Analog Output Fiber-Optic Amplifier. Such sensor amplifier provides an analog output signal in the range of 1–5 volts D.C., depending upon the intensity of the optical signal received by the lens associated therewith. Amplifier 126 is preferably of the type commercially available from SUNX Sensors USA under the Model Name FX-M1; this amplifier is essentially binary in nature rather than analog, and signals that reflected light is either detected or not detected. The analog output generated by sensor amplifier 128, and the binary output generated by sensor amplifier 126, are coupled to the sensor interface board 124, described in greater detail below in conjunction with FIG. 7. In turn, sensor interface board 124 communicates with PLC 120 via the RS232 interface via conductors 121, 123, and 125.

Figure 7:
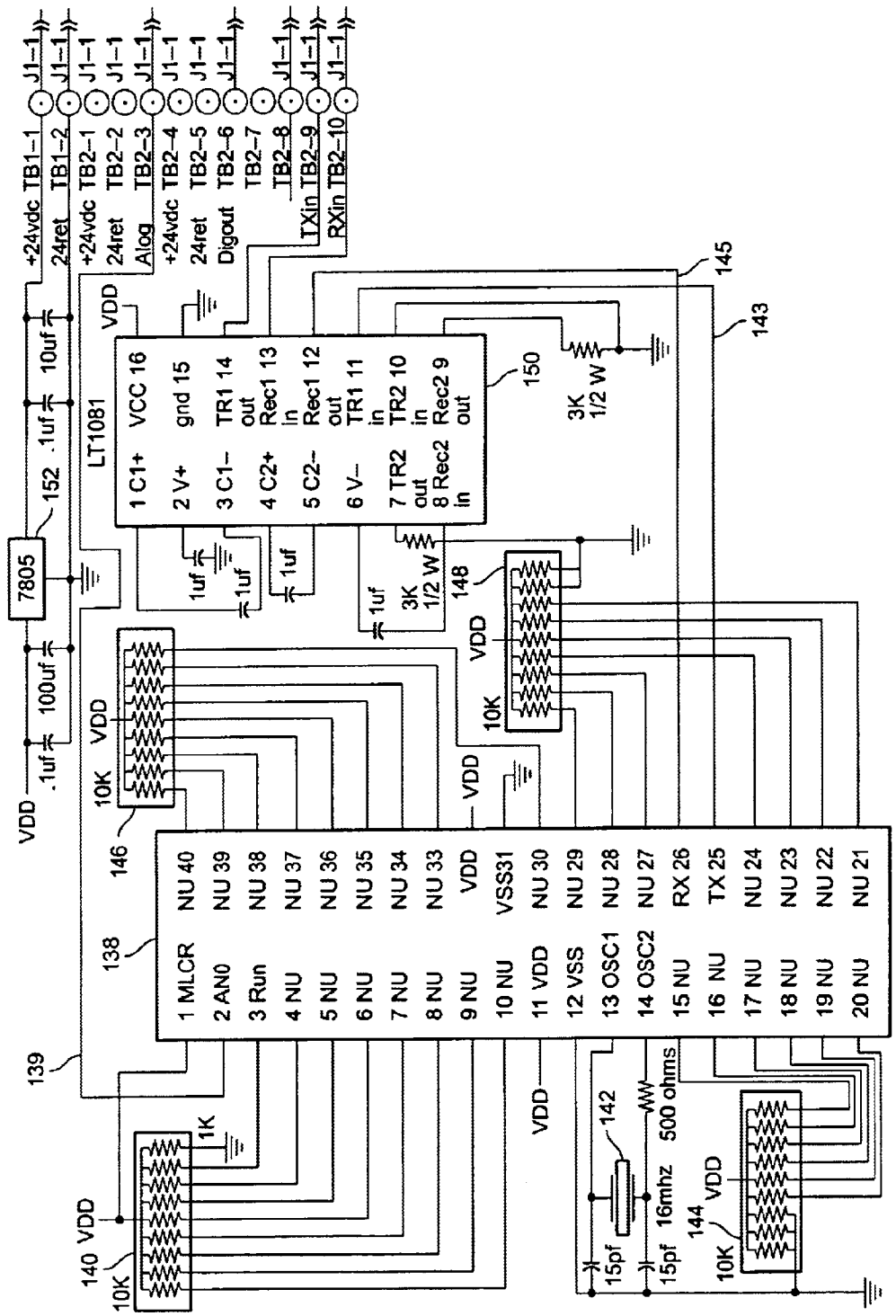
FIG. 7 is a circuit schematic drawing showing the circuitry used to process the light sensor signals generated by the light sensors.

Referring now to the circuit schematic of FIG. 7, the light sensor assembly 46 includes level sensor micro-controller 138 located on the sensor interface board 124 (see FIG. 6). Micro-controller 138 is of the type commercially available from Digi-Key Corporation of Thief River Falls, Minn. under Part No. PIC16F877, manufactured by Microchip Technology Incorporated of Chandler, Ariz. The PIC16F877 is a microcontroller that includes a RISC CPU, 8192×14 words of FLASH program memory, 256 data memory bytes, and 368 bytes of user RAM. The PIC16F876 also includes a 10-bit Analog-to-Digital converter, includes 33 input/output pins, and a universal synchronous asynchronous receiver transmitter (USART) for communications.

As indicated in FIG. 7, a 16 MHZ crystal 142 is coupled across oscillator pins 12 and 13 of microcontroller 138 to properly clock microcontroller 138. Pull-up resistor blocks 140, 144, 146 and 148 are used to "pull-up" the various input and output terminals through a 10K ohm resistor to the positive power supply voltage VDD (approximately 5 volts). Analog input pin 2 of microcontroller 138 is coupled by conductor 139 to the output of analog sensor 128 (see FIG. 6); analog sensor 128 is the sensor amplifier that is responsive to lens 30 of sensor lens assembly 28. Pins 25 and 26 of microcontroller 138 are used as the USART asynchronous transmit signal and asynchronous receive signal, respectively, and are coupled by conductors 143 and 145, respectively, to corresponding terminals of a low power 5 volt RS232 Dual Driver/Receiver chip 150 commercially available from Linear Technology Corporation of Milpitas, Calif. under Part No. LT1081. Dual driver/receiver chip 150 interfaces the transmit and receive ports of microcontroller 138 to the RS232 terminals of programmable logic controller PLC 120 within the controller shown in FIG. 6. Also shown in FIG. 7 is a voltage regulator integrated circuit 152, Type 7805 available from National Semiconductor, which receives a +24 volt power supply at its input terminal, and which provides a well-regulated +5 volt VDD output power voltage to power the components on the sensor interface board 124.

Returning briefly to FIG. 1, it will be recalled that sensor lens assembly 28 includes a second lens 36 and second pair of optical fibers 40 for sensing an "overfill" condition wherein the height of slurry 20 has risen above some maximum safe threshold. Such an overfill condition might result from a failed or misadjusted slurry level sensor. If the overfill sensor has been activated, then the control circuitry within control panel 54 operates a solenoid that permits the full output pressure (70–80 PSI) from the aforementioned main air valve to be applied directly to input port 86 of actuator 84 to immediately shut off the further flow of process fluid through supply tube 22. In this event, the user can regain control over the system by pressing and holding the "clear" button on key pad 58 to clear all alarms, and to de-energize the aforementioned solenoid, in order to once again allow proportional control valve 82 to open and permit slurry to flow therethrough.

Overfill sensor lens 36 will indicate an overfill condition when light beam 38 reflects off of a plain metal casting belt or other highly reflective surface, even though there is actually no slurry in slurry reservoir 15. Accordingly, when first starting the system, control valve 82 must be manually opened, as by the user depressing one of the numeric key pad buttons (the "valve open" button) on key pad 58, to allow new slurry to start filling the slurry reservoir 15, and thereby cover the area of the belt within reservoir 15 below sensor lens 36. Once belt 14 is covered with slurry, overfill sensor lens 36 will not indicate an overfill condition again until the height of the slurry 20 in reservoir 15 has become too high. If desired, control panel 54 may include a built-in alarm unit to provides an audible indication of alarm conditions, such as the aforementioned overfill condition. Port 80 on control panel 54 can optionally be used to transmit an alarm signal to remote equipment.

The aforementioned direct coupling of the main air valve to actuator 84 during an overfill condition also serves to insure that, in the event of a regulator valve failure, control valve 82 will assume its fully-closed position. For example, if electrical power to control panel 54 should be lost, pressurized air from the main air valve is directly coupled to pressure input port 86 of actuator 84 of control valve 82 to pinch off supply tube 22.

To properly set-up control panel 54, one must first determine the slurry level is to be maintained within slurry reservoir 15. The user places a piece of white paper on a precision block that has a thickness equal to the level desired in slurry reservoir 15. This precision block is placed directly beneath sensor lens 30. If sensor lens 30 is too high or too low to detect the presence of the white piece of paper, then the user makes an initial gross adjustment by loosening thumbscrew 48 (see FIG. 3), and manually raising or lowering sensor tube assembly 28 until LCD display 60 shows some amount of slurry reservoir level. At this point, the control panel 54 is turned off, and the precision block and white paper are removed. The level sensor assembly is now ready.

Control panel 54 can be operated either in an automatic mode or in a manual mode. The automatic mode of operation will be described first. On power-up, the controller circuitry within control panel 54 automatically starts control at the most recently used Set Point. The Set Point can be changed, if desired, during the automatic mode by depressing the "up" or "down" keys of key pad 58 to increment or decrement the current Set Point level. To save the new Set Point, the user presses the "save" button on key pad 58. The control circuitry within control panel 54 loads all stored values from an EPROM. The aforementioned alarm will sound initially, and the "alarm" button (the numeric "2" button on key pad 58) must be depressed to put the system into "automatic" mode. If a highly reflective surface is directly beneath overfill sensor lens 36, the alarm will not clear. A user presses the "valve-open" button on key pad 58, and holds it until control valve 82 opens to allow slurry to be dispensed into slurry reservoir 15. It will be noted that there is also a "valve-closed" button on key pad 58 which can be used to shut off control valve 82, if desired. In any event, the user continues to depress the "valve-open" button until slurry 20 covers the portion of belt 14 beneath sensor lens assembly 28. Once process fluid is detected below sensor lens 30, a slurry level reading will be displayed by LCD display panel 60. Initially, the displayed slurry level reading will be less than that of the Set Point of the system.

As the fluid level increases in slurry reservoir 15 and approaches the Set Point, the control system starts to close control valve 82 to decrease the flow of slurry therethrough. When the sensor detects that the slurry height matches the Set Point level, control valve 82 is fully-closed to pinch-off any further flow of slurry therethrough. In contrast, if the control system senses a drop in the level of the slurry 20 within reservoir 15 below the Set Point level, then control valve 82 begins to open to increase the flow of slurry into reservoir 15. The control system uses a custom PID function to make real-time adjustments to control valve 82 to control the level of slurry within reservoir 15 to within 0.012 inch of the Set Point level. This automatic mode of operation is the default mode, and controls the slurry level depending upon feedback from the height sensor.

In manual mode, the "up" and "down" keys of key pad 58 are used to adjust the flow of control valve 82. Pressing and holding the "up" key increases slurry flow through control valve 82, whereas pressing and holding the "down" key decreases slurry flow through control valve 82. The current flow rate is indicated in the upper right hand corner of LCD display 60. When manual mode is selected, the sensor lens assembly 28 has no effect on the position of control valve 82 or the resulting slurry flow rate; if desired, however, sensor lens assembly 28 may still trigger the generation of alarms.

The applicant became aware of a phenomena called "backlash," which relates to the inertia of the control valve. It has been noted that, when the direction of valve movement is reversed, the change in air pressure required to cause such reversal is greater than originally anticipated. In effect, flow control valve 82 of FIG. 5 exhibits a form of mechanical hysteresis. If such hysteresis, or backlash, is not compensated, then the relationship between the regulated air pressure and the corresponding slurry flow rate through control valve 82 will not be as linear as desired.

The microcode which controls the programmable logic controller (PLC) 120 in controller cabinet 54 is therefore written in a manner to compensate for such backlash. The microcode stores a voltage value that represents a voltage within the 1–5 volt range of the analog output signal driven onto conductor 135 by PLC 120 and input to proportional regulator air valve 136. This value is determined in advance by the process engineer by performing the following operation. The process engineer, would pressurize control valve 82 to a given point, and position a ruler or other distance measuring device adjacent to the valve ram/jaw 102. The engineer would then increase the air pressure applied to port 86 of actuator 84 until ram 102 moved to a new position of smaller separation distance relative to jaw 106. The engineer would then "zero" the measuring device, and begin decreasing the air pressure supplied to port 86 of actuator 84 of control valve 82, while watching both the line input air pressure and the measuring device. At the point where the measuring device shows motion of ram/jaw 102, the engineer takes note of how much the input air pressure was reduced to obtain such movement; in this example, it will be assumed that the input air pressure had to be reduced by 3 psi. The engineer would then enter the Backlash factor as 3 in the microcode for PLC 120. PLC 120 stores a voltage value proportional to the amount of total air pressure that is output by proportional air valve 136 that the backlash factor represents.

For example, if proportional air valve 136 puts out a maximum of 70 psi, then 3 psi represents 3/70 of the total analog voltage range, or 3/70 of the 4 volt analog output voltage range (5 volts max minus 1 volt min), or 0.1714 volts. This value remains a constant as long as the factor remains set at 3 psi. During start-up of the level control system, PLC 120 initially causes the analog output voltage conducted by conductor 135 to its maximum voltage of 5 volts for directing proportional air valve 136 to apply maximum pressure (70 PSI) to actuator 84 of control valve 82. Thus, any subsequent movement of such analog output voltage must be in the negative direction (i.e., less than +5 volts). PLC 120 keeps track of the past two values of such analog voltage; hence, PLC 120 can compare such values and recognize when the direction of valve movement has changed. For example, if PLC 120 originally produced an analog voltage of 4.5 volts, then 4.3 volts, followed by 4.4 volts, then PLC 120 would know that the direction of valve movement has changed; PLC 120 would then add or subtract (depending on the direction of the change) the backlash factor voltage to the new targeted output voltage in order to overcome the backlash of the valve. In this example, the new analog output voltage driven by PLC 120 onto conductor 135 would be 4.4 volts plus the backlash factor of 0.1714 volts, or 4.5714 volts.

Those skilled in the art will now appreciate that an improved level control system, suitable for use in, among other things, tape casting processes, has been described which more accurately controls the thickness of the cast tape produced. It will be appreciated that the disclosed apparatus is relatively inexpensive and simple to construct, and that it reduces the risk of explosion by isolating electrical spark-generating components from the volatile atmosphere of the process fluid. The disclosed level control system allows the slurry fluid level to be monitored in real time, and rapidly adjusts supply flow rates to maintain a desired level. While the present invention has been described with respect to a preferred embodiment thereof, such description is for illustrative purposes only, and is not to be construed as limiting the scope of the invention. Various modifications and changes may be made to the described embodiments by those skilled in the art without departing from the true spirit and scope of the invention as defined by the appended claims.

I claim:

1. A level control system for controlling the thickness of a work material in a slurry form, said level control system comprising in combination:
   a. a moving belt;
   b. a fluid reservoir for dispensing slurry onto the moving belt, the moving belt forming at least a portion of the floor of the fluid reservoir;
   c. a control valve for filling the fluid reservoir with slurry at a controlled rate;
   d. a blade positioned above the moving belt for regulating the thickness of the slurry that passes beyond said blade;
   e. a lens disposed near the moving belt above said fluid reservoir for receiving light reflected from the upper surface of the slurry within the fluid reservoir before the slurry passes beyond said blade, and for detecting the height of the slurry within the fluid reservoir;
   f. a light sensor disposed relatively remote from the slurry, said light sensor generating electrical signals in response to light received thereby;
   g. a fiber optic cable extending between the lens and the light sensor for coupling light received by said lens to said light sensor; and
   h. a control circuit coupled to said light sensor and responsive to said electrical signals for generating a control signal, said control circuit being coupled to said control valve for providing said control signal to regulate the flow of slurry through said control valve.

2. The level control system recited by claim 1 wherein said control valve is responsive to pneumatic pressure, and wherein said control circuit provides said control signal in the form of a regulated pneumatic pressure to said control valve.

3. The level control system recited by claim 2 wherein said regulated pneumatic pressure is substantially inversely proportional to the rate of flow of slurry through said control valve.

4. A level control system for controlling the thickness of a work material in a slurry form, said level control system comprising in combination:
   a. a moving belt system;
   b. a fluid reservoir for dispensing slurry onto the moving belt;
   c. a control valve for filling the fluid reservoir with slurry at a controlled rate, and wherein said control valve is responsive to pneumatic pressure;
   d. a blade positioned above the moving belt for regulating the thickness of the slurry that passes beyond said blade;

e. a lens disposed near the moving belt between said fluid reservoir and said blade for receiving light reflected from the upper surface of the slurry;

f. a light sensor disposed relatively remote from the slurry, said light sensor generating electrical signals in response to light received thereby;

g. a fiber optic cable extending between the lens and the light sensor for coupling light received by said lens to said light sensor; and h. a control circuit coupled to said light sensor and responsive to said electrical signals for generating a control signal, said control circuit being coupled to said control valve for providing said control signal to regulate the flow of slurry through said control valve, wherein said control circuit provides said control signal in the form of a regulated pneumatic pressure to said control valve, and wherein said control circuit includes a pressure regulator responsive to said electrical signals for generating said control signal.

5. A level control system for controlling the thickness of a work material in a slurry form, said level control system comprising in combination:

a. a moving belt;

b. a fluid reservoir for dispensing slurry onto the moving belt;

c. a control valve for filling the fluid reservoir with slurry at a controlled rate;

d. a blade positioned above the moving belt for regulating the thickness of the slurry that passes beyond said blade;

e. a lens disposed near the moving belt above said fluid reservoir for receiving light reflected from the upper surface of the slurry within the fluid reservoir before the slurry passes beyond said blade, and for detecting the height of the slurry within the fluid reservoir;

f. a light sensor disposed relatively remote from the slurry, said light sensor generating electrical signals in response to light received thereby;

g. a fiber optic cable extending between the lens and the light sensor for coupling light received by said lens to said light sensor; and h. a control circuit coupled to said light sensor and responsive to said electrical signals for generating a control signal, said control circuit being coupled to said control valve for providing said control signal to regulate the flow of slurry through said control valve.

* * * * *